US007403150B1

(12) United States Patent
Heshami et al.

(10) Patent No.: US 7,403,150 B1
(45) Date of Patent: Jul. 22, 2008

(54) ANALOG-TO-DIGITAL CONVERTER ARCHITECTURE USING A CAPACITOR ARRAY STRUCTURE

(75) Inventors: Mehrdad Heshami, Palo Alto, CA (US); Mansour Keramat, San Jose, CA (US)

(73) Assignee: Alvand Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/524,989

(22) Filed: Sep. 20, 2006

(51) Int. Cl.
*H03M 1/36* (2006.01)
(52) U.S. Cl. .................. 341/159; 341/155; 341/158; 341/172
(58) Field of Classification Search ............... 341/159, 341/172
See application file for complete search history.

(56) References Cited

U.S. PATENT DOCUMENTS

| 4,742,330 A | * | 5/1988 | Doernberg et al. | 341/159 |
| 5,225,837 A | * | 7/1993 | Hosotani et al. | 341/159 |
| 5,470,121 A | * | 11/1995 | Ito | 296/65.14 |
| 6,617,994 B1 | * | 9/2003 | Heim et al. | 341/172 |
| 2007/0040723 A1 | * | 2/2007 | Snoeijs | 341/172 |

OTHER PUBLICATIONS

Koen Uyttenhove and Michiel Steyaert—A 1.8-V, 6-bit, 1.3GHz CMOS Flash ADC in 0.25 µm CMOS. *ESAT—MICAS K.U. Leuven, Kasteelpark Arenberg 10, 3001 Heverlee, Belgium Tel.: +32 16 32 1070* koen.uttenhove@esat.kuleuven.ac.be ESSCIRC 2002, no month.

* cited by examiner

*Primary Examiner*—Khai M Nguyen
(74) *Attorney, Agent, or Firm*—Stattler-Suh PC

(57) ABSTRACT

An analog-to-digital converter architecture is described. An analog-to-digital converter circuit includes a switched capacitor circuit structure to receive an input voltage signal and one or more reference voltage signals. The analog-to-digital converter circuit also includes a comparator device array coupled to the switched capacitor circuit structure. The comparator device array further includes multiple comparator devices coupled in parallel, each comparator device having a pair of inputs coupled to the switched capacitor circuit structure to receive a voltage output signal from the switched capacitor circuit, a voltage value of the voltage output signal being calculated as a difference between an input voltage value of the input voltage signal and a predetermined value of the reference voltage signal, which is dependent on the position of the respective comparator device within the comparator device array, each comparator device experiencing an identical common mode voltage input within the analog-to-digital converter circuit.

13 Claims, 5 Drawing Sheets

ANALOG-TO-DIGITAL CONVERTER ARCHITECTURE USING A CAPACITOR ARRAY STRUCTURE

BACKGROUND OF THE INVENTION

1. Field of the Invention

The present invention relates generally to analog-to-digital converters, and, more particularly, to an analog-to-digital converter architecture using a capacitor array structure.

2. Art Background

Low voltage analog design needs to comply with the ever decreasing digital supply voltage used for an entire mixed-signal chip structure. Supply voltages in deep submicron CMOS technologies decrease constantly due to the short channel effects, and, thus, the need arises for low voltage analog-to-digital converters. A flash analog-to-digital converter ("ADC"), also known as a parallel ADC, is the fastest way to convert an analog signal to a digital signal. Generally, a flash ADC is comprised of multiple cascading high-speed comparator devices, each comparator device having two pair of inputs coupled to a resistive divider circuit and an output coupled to a digital encoder.

In a conventional ADC, each comparator device experiences a different common-mode input voltage, which may prove challenging in the design of the comparator device. In addition, each comparator device requires two pairs of inputs, which may increase the complexity of the comparator device and may create a larger undesired input offset voltage. Thus, what is needed is an architecture containing comparator devices, each comparator device experiencing an identical common-mode input voltage at a desired voltage and having only one pair of inputs.

SUMMARY OF THE INVENTION

An analog-to-digital converter architecture is described. In embodiments described in detail below, an analog-to-digital converter circuit includes a switched capacitor circuit structure to receive an input voltage signal and one or more reference voltage signals. The analog-to-digital converter circuit also includes a comparator device array coupled to the switched capacitor circuit structure. The comparator device array further includes multiple comparator devices coupled in parallel, each comparator device having a pair of inputs coupled to the switched capacitor circuit structure to receive a voltage output signal from the switched capacitor circuit, a voltage value of the voltage output signal being calculated as a difference between an input voltage value of the input voltage signal and a predetermined value of the reference voltage signal, which is dependent on the position of the respective comparator device within the comparator device array. In embodiments described in detail below, each comparator device experiences an identical common mode voltage input within the analog-to-digital converter circuit, irrespective of its position within the comparator device array.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

In the following detailed description of embodiments of the invention, reference is made to the accompanying drawings in which like references indicate similar elements, and in which are shown by way of illustration specific embodiments in which the invention may be practiced. These embodiments are described in sufficient detail to enable those skilled in the art to practice the invention, and it is to be understood that other embodiments may be utilized and that logical, mechanical, electrical, functional, and other changes may be made without departing from the scope of the present invention. The following detailed description is, therefore, not to be taken in a limiting sense, and the scope of the present invention is defined only by the appended claims.

In embodiments described in detail below, an analog-to-digital converter circuit includes a switched capacitor circuit structure to receive an input voltage signal and one or more reference voltage signals. The analog-to-digital converter circuit also includes a comparator device array coupled to the switched capacitor circuit structure. The comparator device array further includes multiple comparator devices coupled in parallel, each comparator device having a pair of inputs coupled to the switched capacitor circuit structure to receive a voltage signal output by the switched capacitor circuit and having a value calculated as a difference between an input voltage value of the input voltage signal and a predetermined value of the reference voltage signal, which is dependent on the location of the respective comparator device within the comparator device array. In one embodiment, each comparator device receives an identical common mode voltage input within the analog-to-digital converter circuit irrespective of its position within the comparator device array.

Figure 1:
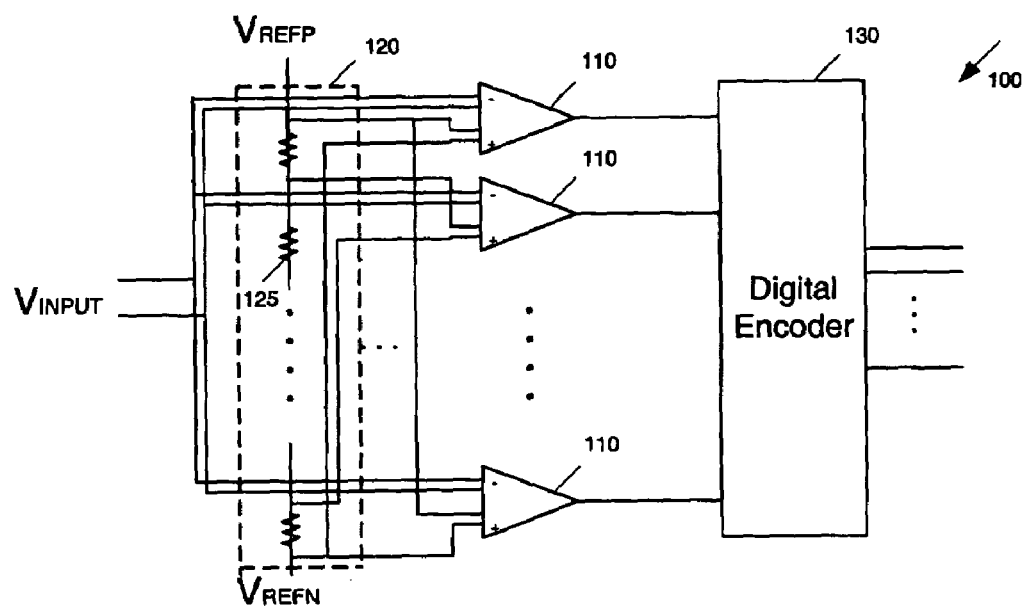
FIG. 1 is a block diagram illustrating a conventional analog-to-digital converter architecture.

FIG. 1 is a block diagram illustrating a conventional analog-to-digital converter ("ADC") 100. The ADC 100 includes multiple comparator devices 110 coupled in parallel, each comparator device 110 having at least two pairs of inputs coupled to a resistive divider circuit 120 and an output coupled to a digital encoder 130.

The resistive divider circuit 120 further includes multiple resistor devices 125 and generates a reference voltage $V_{REF}$, ranging between a positive voltage value $V_{REFP}$ and a negative voltage value $V_{REFN}$. For an N-bit ADC 100, such as, for example, a 6-bit converter, the circuit employs $2^N-1$ comparator devices 110, such as, for example, 63 comparator devices, and $2^N$ resistor devices 125, such as, for example, 64 resistor devices.

Each comparator device 110 compares the input voltage $V_{INPUT}$ at the ADC 100 to the corresponding value of the reference voltage $V_{REF}$ at the input of the respective comparator device 110. The reference voltage $V_{REF}$ value for each comparator device 110 is one least significant bit ("LSB") greater than the reference voltage $V_{REF}$ value for the comparator device 110 immediately below it. Each comparator device 110 produces a "1" value if its analog input voltage value $V_{INPUT}$ is higher than the reference voltage value $V_{REF}$ applied to it. Otherwise, the output of the respective comparator device 110 is "0."

In the conventional ADC architecture shown in FIG. 1, each comparator device 110 experiences a different common-mode input voltage ranging from $V_{REFN}$ to $V_{REFP}$, which may prove challenging in the design of the comparator device 110. In addition, each comparator device 110 requires two pairs of inputs, which may increase the complexity of the comparator device 110 and may create a larger undesired input offset voltage.

Figure 2:
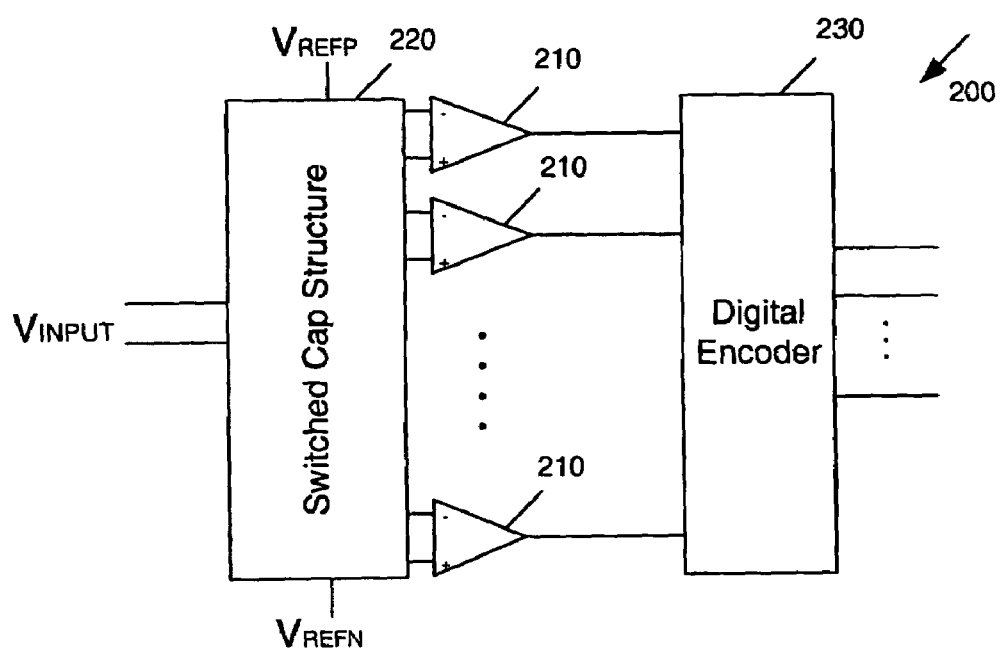
FIG. 2 is a block diagram illustrating an analog-to-digital converter architecture, according to one embodiment of the invention.

FIG. 2 is a block diagram illustrating an ADC architecture, according to one embodiment of the invention. As shown in FIG. 2, in one embodiment, an ADC 200 includes multiple cascading comparator devices 210 within a comparator device array, each comparator device 210 having at least one pair of inputs coupled to a switched capacitor circuit structure 220 and an output coupled to a digital encoder 230. If N is the number of bits in the ADC architecture 200, such as, for example, N=6 bits, then the ADC 200 includes $2^N-1$ comparator devices 210, such as, for example, $2^6-1=63$ comparator devices.

In one embodiment, the switched capacitor circuit structure 220 includes multiple capacitor devices, as described in further detail below in connection with FIG. 3. The switched capacitor circuit structure 220 receives the input voltage signal $V_{INPUT}$ and a reference voltage signal $V_{REF}$, ranging between a positive voltage value $V_{REFP}$ and a negative voltage value $V_{REFN}$.

Figure 3:
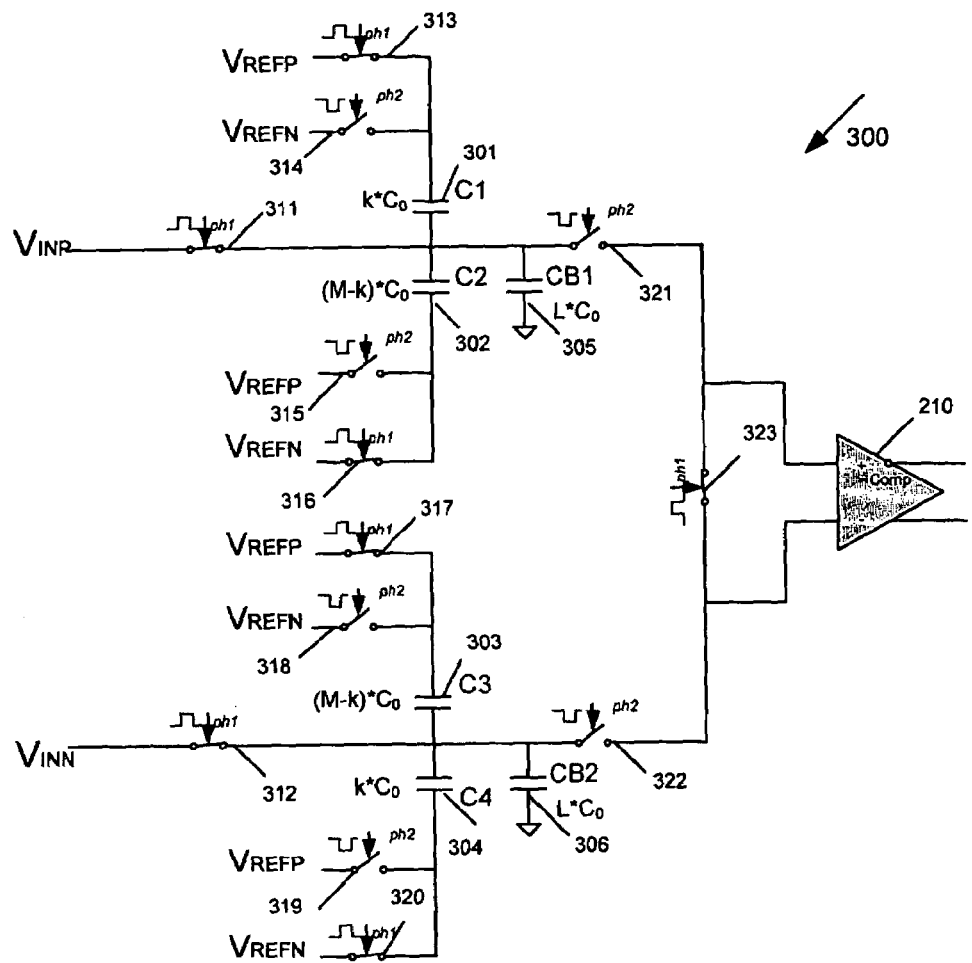
FIG. 3 is a schematic diagram illustrating a switched capacitor circuit structure within the analog-to-digital converter architecture, according to one embodiment of the invention.

FIG. 3 is a schematic diagram illustrating a switched capacitor circuit structure within the analog-to-digital converter architecture, according to one embodiment of the invention. As illustrated in FIG. 3, a switched capacitor circuit 300 is coupled to each comparator device 210 within the ADC 200 shown in FIG. 2.

In one embodiment, the switched capacitor circuit 300 further includes multiple capacitor devices 301 through 304 having capacitance values calculated as a function of a predetermined capacitance value $C_0$ and a parameter "k." The value of the parameter "k" varies from one comparator device 210 to another and determines the reference voltage signal $V_{REF}$ associated with each respective comparator device 210. In the embodiment of FIG. 3, capacitor devices 301 and 304 have a respective $k*C_0$ capacitance value and capacitor devices 302 and 303 have a respective $(M-k)*C_0$ capacitance value, where k=0, 1, 2, ..., M and represents the position or location of the comparator device 210 within the comparator array of the ADC 200. Each capacitor device 301, 302, 303, 304 may be implemented using a known metal-insulator-metal ("MIM") structure or, in the alternative, a known metal-oxide-metal ("MOM") structure.

In one embodiment, the switched capacitor circuit 300 further includes capacitor devices 305 and 306, each being coupled to ground and having a respective $L*C_0$ capacitance value. In one embodiment, parameter "L" is an optional parameter for scaling down the reference voltage signal $V_{REF}$ at the input of each comparator device 210 by a factor of M/(M+L). In one embodiment, L=0. Alternatively, L has a positive value. In one embodiment, the switched capacitor circuit 300 further includes multiple switches 311 through 323, which are synchronized to maintain an open state or a closed state based on the value of the clock signal within the respective sampling and comparison phases, as described in further detail below.

In one embodiment, during the sampling phase "ph1," switches 311, 312, 313, 316, 317, 320, and 323 are closed. As a result, the differential input voltages $V_{INP}$ and $V_{INN}$ are respectively sampled onto the top plate of capacitor devices 301 through 306 and a combination of reference voltages $V_{REFP}$ and $V_{REFN}$ is respectively sampled onto the bottom plate of capacitor devices 301 through 304. For example, as shown in FIG. 3, $V_{INP}$ is sampled onto the capacitor devices 301, 302, and 305 and $V_{INN}$ is sampled onto the capacitor devices 303, 304, and 306. In addition, $V_{REFP}$ is sampled onto capacitor devices 301 and 303, and $V_{REFN}$ is sampled onto capacitor devices 302 and 304. During the sampling phase "ph1," the differential input pair of the comparator device 210 may be shorted by the closing of the switch 323 and by the opening of switches 321 and 322.

In one embodiment, during the comparison phase "ph2," switches 311 and 312 are open and the differential input voltages are disconnected from the respective capacitor devices 301 through 306. At the same time, switches 321 and 322 are closed, switch 323 is open, and the capacitor array is coupled to the differential input of the comparator device 210.

During the comparison phase "ph2," switches 314, 315, 318, 319 are also closed and, thus, the reference voltages $V_{REFP}$ and $V_{REFN}$ are respectively sampled onto the bottom plate of capacitor devices 301 through 304 opposite to the values sampled during the sampling phase "ph1," such that $V_{REFP}$ is sampled onto capacitor devices 302 and 304, and $V_{REFN}$ is sampled onto capacitor devices 301 and 303.

In one embodiment, the differential voltage at the input of the comparator device 210 may be calculated as follows:

$$V_{COMP\_IN}=(V_{INP}-V_{INN})-(2(M-2k)/(M+L))(V_{REFP}-V_{REFN})$$

where k=0, 1, 2, ..., M, represents the location of each respective comparator device 210 within the comparator device array of the ADC 200.

Thus, the common mode voltage input to all comparator devices 210 within the ADC 200 is:

$$V_{COMP\_IN\_CM}=(V_{INP}+V_{INN})/2$$

As a result, according to the above equation, the common mode voltage inputs to each respective comparator device 210 are identical and are independent of the position of each comparator device 210 within the comparator device array of the ADC 200.

Figure 4:
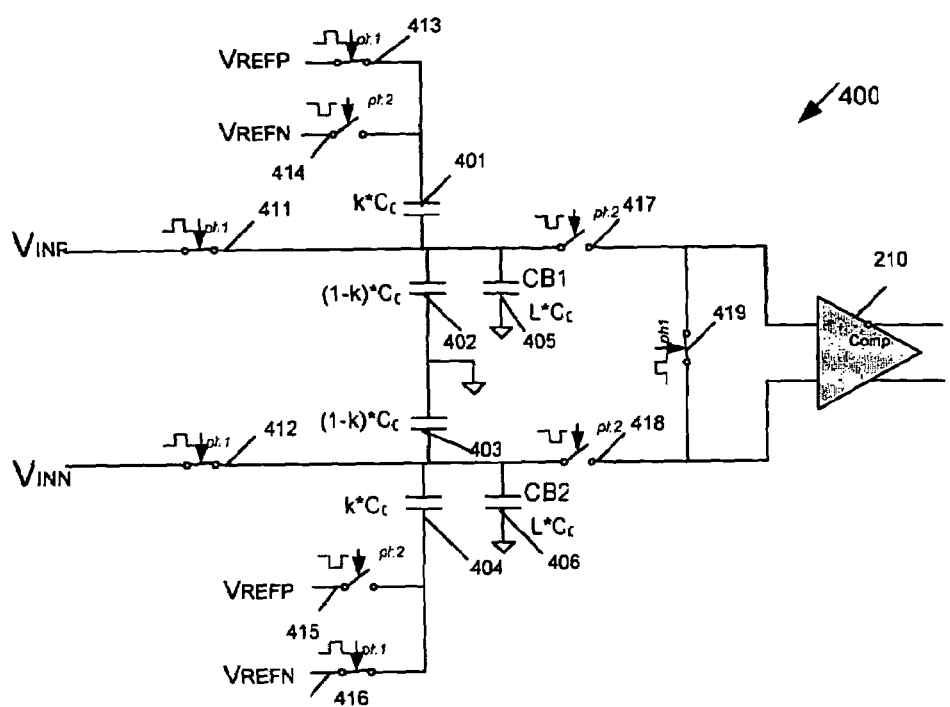
FIG. 4 is a schematic diagram illustrating a switched capacitor circuit structure within the analog-to-digital converter architecture, according to an alternate embodiment of the invention.

FIG. 4 is a schematic diagram illustrating a switched capacitor circuit structure within the analog-to-digital converter architecture, according to an alternate embodiment of the invention. As illustrated in FIG. 4, a switched capacitor circuit 400 is coupled to each comparator device 210 within the ADC 200 shown in FIG. 2.

In one embodiment, the switched capacitor circuit 400 further includes multiple capacitor devices 401 through 404 having capacitance values calculated as a function of a predetermined capacitance value $C_0$ and a parameter "k." The value of the parameter "k" varies from one comparator device 210 to another and determines the reference voltage signal $V_{REF}$ associated with each respective comparator device 210. In the embodiment of FIG. 4, capacitor devices 401 and 404 have a respective $k*C_0$ capacitance value and capacitor devices 402 and 403 have a respective $(1-k)*C_0$ capacitance value, where k=0, 1, 2, ..., (M-1)/2, and represents the location of the comparator device 210 within the comparator array of the ADC 200. Each capacitor device 401, 402, 403, 404 may be implemented using a known metal-insulator-metal ("MIM") structure or, in the alternative, a known metal-oxide-metal ("MOM") structure.

In one embodiment, the switched capacitor circuit 400 further includes capacitor devices 405 and 406, each being coupled to ground and having a respective $L*C_0$ capacitance value. In one embodiment, parameter "L" is an optional parameter for scaling down the reference voltage signal $V_{REF}$ at the input of each comparator device 210 by a factor of M/(M+L). In one embodiment, L=0. Alternatively, L has a positive value. In one embodiment, the switched capacitor circuit 400 further includes multiple switches 411 through 419, which are synchronized to maintain an open state or a closed state based on the value of the clock signal within the respective sampling and comparison phases, as described in further detail below.

In one embodiment, during the sampling phase "ph1," switches 411, 412, 413, 416, and 419 are closed. As a result, the differential input voltages $V_{INP}$ and $V_{INN}$ are respectively sampled onto the top plate of capacitor devices 401 through 406 and a combination of reference voltages $V_{REFP}$ and $V_{REFN}$ is respectively sampled onto the bottom plate of capacitor devices 401 and 404. For example, as shown in FIG. 4, $V_{INP}$ is sampled onto the capacitor devices 401, 402, and 405 and $V_{INN}$ is sampled onto the capacitor devices 403, 404, and 406. In addition, $V_{REFP}$ is sampled onto capacitor device 401 and $V_{REFN}$ is sampled onto capacitor device 404. During the sampling phase "ph1," the differential input pair of the comparator device 210 may be shorted by the closing of the switch 419 and by the opening of switches 417 and 418.

In one embodiment, during the comparison phase "ph2," switches 411 and 412 are open and the differential input voltages are disconnected from the respective capacitor devices 401 through 406. At the same time, switches 417 and 418 are closed, switch 419 is open, and the capacitor array is coupled to the differential input of the comparator device 210. During the comparison phase "ph2," switches 414, 415 are also closed and, thus, the reference voltages $V_{REFP}$ and $V_{REFN}$ are respectively sampled onto the bottom plate of capacitor devices 401 and 404 opposite to the values sampled during the sampling phase "ph1," such that $V_{REFP}$ is sampled onto capacitor device 404, and $V_{REFN}$ is sampled onto capacitor device 401.

Figure 5:
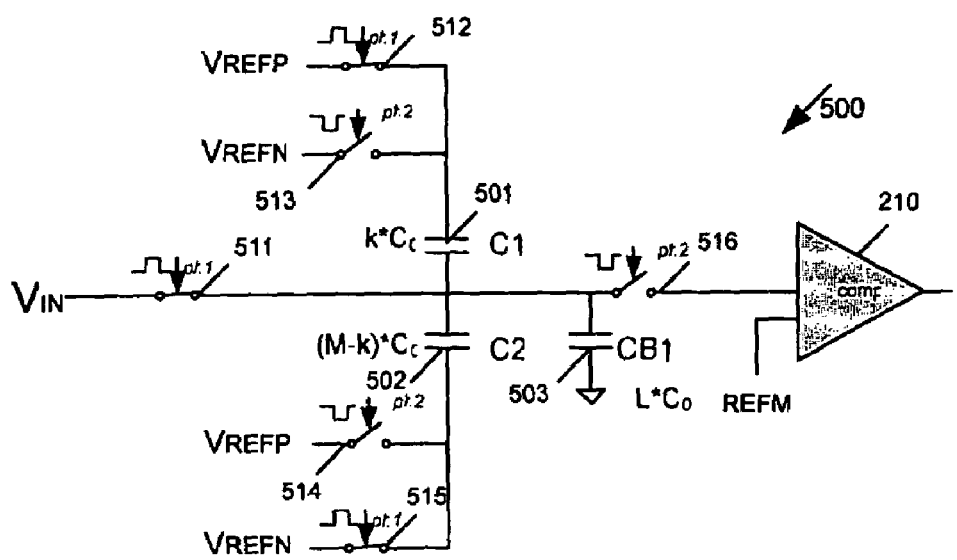
FIG. 5 is schematic diagram illustrating a switched capacitor circuit structure within the analog-to-digital converter architecture, according to another alternate embodiment of the invention.

FIG. 5 is schematic diagram illustrating a switched capacitor circuit structure within the analog-to-digital converter architecture, according to another alternate embodiment of the invention. As illustrated in FIG. 5, a switched capacitor circuit 500 is coupled to each comparator device 210 within the ADC 200 shown in FIG. 2.

In one embodiment, the switched capacitor circuit 500 further includes multiple capacitor devices 501 and 502 having capacitance values calculated as a function of a predetermined capacitance value $C_0$ and a parameter "k." The value of the parameter "k" varies from one comparator device 210 to another and determines the reference voltage signal $V_{REF}$ associated with that respective comparator device 210. In the embodiment of FIG. 5, capacitor device 501 has a $k*C_0$ capacitance value and capacitor device 502 has a respective $(M-k)*C_0$ capacitance value, where k=0, 1, 2, ..., M, and represents the location of the comparator device 210 within the comparator array of the ADC 200. Each capacitor device 501, 502 may be implemented using a known metal-insulator-metal ("MIM") structure or, in the alternative, a known metal-oxide-metal ("MOM") structure.

In one embodiment, the switched capacitor circuit 500 further includes a capacitor device 503 coupled to ground and having a respective $L*C_0$ capacitance value. In one embodiment, parameter "L" is an optional parameter for scaling down the reference voltage signal $V_{REF}$ at the input of each comparator device 210 by a factor of M/(M+L). In one embodiment, L=0. Alternatively, L has a positive value. In one embodiment, the switched capacitor circuit 500 further includes multiple switches 511 through 516, which are synchronized to maintain an open state or a closed state based on the value of the clock signal within the respective sampling and comparison phases, as described in further detail below.

In one embodiment, during the sampling phase "ph1," switches 511, 512, and 515 are closed. Thus, the input voltage $V_{IN}$ is sampled onto the top plate of capacitor devices 501 through 503 and reference voltages $V_{REFP}$ and $V_{REFN}$ are sampled onto the bottom plate of capacitor devices 501 and 502, respectively.

In one embodiment, during the comparison phase "ph2," switches 511, 512, and 515 are open. Thus, the input voltage $V_{IN}$ is disconnected from the respective capacitor devices 501 through 503. At the same time, switches 513, 514, and 516 are closed and, thus, the reference voltages $V_{REFP}$ and $V_{REFN}$ are sampled onto the bottom plate of capacitor devices 501 and 502 opposite to the values sampled during the sampling phase "ph1," such that $V_{REFP}$ is sampled onto capacitor device 502, and $V_{REFN}$ is sampled onto capacitor device 501. The capacitor devices 501 through 503 are further coupled to the input of the comparator device 210.

In one embodiment, the voltage at the input of the comparator device 210 may be calculated as follows:

$$V_{COMP\_IN} = V_{IN} - ((M-2k)/(M+L))(V_{REFP} - V_{REFN})$$

where k=0, 1, 2, ..., M, represents the location of each respective comparator device 210 within the comparator device array of the ADC 200. Thus, a trigger point of all comparator devices 210 within the ADC 200 may be a fixed reference voltage $V_{REFM}$, as opposed to a conventional resistive flash ADC 100, as shown in FIG. 1, which requires each comparator device 110 to have a different trigger point ranging in value from $V_{REFN}$ to $V_{REFP}$.

It is to be understood that embodiments of the present invention may be implemented not only within a physical circuit (e.g., on semiconductor chip) but also within machine-readable media. For example, the circuits and designs discussed above may be stored upon and/or embedded within machine-readable media associated with a design tool used for designing semiconductor devices. Examples include a netlist formatted in the VHSIC Hardware Description Language (VHDL) language, Verilog language or SPICE language. Some netlist examples include: a behavioral level netlist, a register transfer level (RTL) netlist, a gate level netlist and a transistor level netlist. Machine-readable media also include media having layout information such as a GDS-II file. Furthermore, netlist files or other machine-readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine-readable medium. A machine-readable medium includes any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

Although the present invention has been described in terms of specific exemplary embodiments, it will be appreciated that various modifications and alterations might be made by those skilled in the art without departing from the spirit and scope of the invention.

What is claimed is:

1. A circuit comprising:
   a switched capacitor circuit structure to receive an input voltage signal and at least one reference voltage signal; and
   a comparator device array coupled to the switched capacitor circuit structure;
   said comparator device array further comprising a plurality of comparator devices coupled in parallel, each respective comparator device having a pair of inputs coupled to said switched capacitor circuit structure to receive a voltage output signal from said switched capacitor circuit, a voltage value of said voltage output signal being calculated as a difference between an input voltage value of said input voltage signal and a predetermined value of said at least one reference voltage signal, which is dependent on a position of said each respective comparator device within said comparator device array, wherein each comparator device receives an identical common mode voltage input irrespective of said position within said comparator device array, wherein said identical common mode voltage input is calculated as $(V_{INP}+V_{INN})/2$, wherein $V_{INP}$ is a positive differential input voltage value of said input voltage signal and $V_{INN}$ is a negative differential input voltage value of said input voltage signal.

2. The circuit according to claim 1, further comprising a digital encoder coupled to an output of said comparator device array.

3. The circuit according to claim 1, wherein said switched capacitor circuit structure further comprises a plurality of capacitor devices having capacitance values calculated as a function of a predetermined capacitance and a parameter value representing said position of said each respective comparator device within said comparator device array.

4. The circuit according to claim 3, wherein each capacitor device of said plurality of capacitor devices is implemented using a metal-insulator-metal structure.

5. The circuit according to claim 3, wherein each capacitor device of said plurality of capacitor devices is implemented using a metal-oxide-metal structure.

6. A method comprising:
   coupling a pair of inputs of each comparator device of a plurality of comparator devices coupled in parallel within a comparator device array to an output of a switched capacitor circuit structure; and
   coupling a digital encoder to an output of said comparator device array;
   said switched capacitor circuit structure to receive an input voltage signal and at least one reference voltage signal and to output a voltage signal to said each comparator device;
   said each comparator device to receive said voltage output signal, a voltage value of said voltage output signal being calculated as a difference between an input voltage value of said input voltage signal and a predetermined value of said at least one reference voltage signal, which is dependent on a position of said each comparator device within said comparator device array, wherein said each comparator device receives an identical common mode voltage input irrespective of said position within said comparator device array, wherein said identical common mode voltage input is calculated as $(V_{INP}+V_{INN})/2$, wherein $V_{INP}$ is a positive differential input voltage value of said input voltage signal and $V_{INN}$ is a negative differential input voltage value of said input voltage signal.

7. The method according to claim 6, further comprising coupling a digital encoder to an output of said comparator device array.

8. The method according to claim 6, wherein said switched capacitor circuit structure further comprises a plurality of capacitor devices having capacitance values calculated as a function of a predetermined capacitance and a parameter value representing said position of said each respective comparator device within said comparator device array.

9. A circuit comprising:
   a switched capacitor circuit to receive an input voltage signal and at least one reference voltage signal; and
   a comparator device having two inputs coupled to said switched capacitor circuit to receive a voltage output signal from said switched capacitor circuit, a voltage value of said voltage output signal being calculated as a difference between an input voltage value of said input voltage signal and a predetermined value of said at least one reference voltage signal, which is dependent on a position of said comparator device within a comparator device array comprising a plurality of comparator devices coupled in parallel, wherein said comparator device receives an identical common mode voltage input irrespective of said position within said comparator device array, wherein said identical common mode voltage input is calculated as $(V_{INP}+V_{INN})/2$, wherein $V_{INP}$ is a positive differential input voltage value of said input voltage signal and $V_{INN}$ is a negative differential input voltage value of said input voltage signal.

10. The circuit according to claim 9, further comprising a digital encoder coupled to an output of said comparator device.

11. The circuit according to claim 9, wherein said switched capacitor circuit further comprises a plurality of capacitor devices having capacitance values calculated as a function of a predetermined capacitance and a parameter value representing said position of said each respective comparator device within said comparator device array.

12. The circuit according to claim 11, wherein each capacitor device of said plurality of capacitor devices is implemented using a metal-insulator-metal structure.

13. The circuit according to claim 11, wherein each capacitor device of said plurality of capacitor devices is implemented using a metal-oxide-metal structure.

* * * * *